United States Patent [19]

Hara et al.

[11] Patent Number: 4,854,284
[45] Date of Patent: Aug. 8, 1989

[54] ROTATION ANGLE MEASURING APPARATUS

[75] Inventors: Seiichiro Hara, Katsuta; Yoshikazu Hoshi, Ibaraki, both of Japan

[73] Assignees: Hitachi, Ltd.; Hitachi Automotive Engineering Co., Ltd., both of Tokyo, Japan

[21] Appl. No.: 179,988

[22] Filed: Apr. 11, 1988

[30] Foreign Application Priority Data

Apr. 10, 1987 [JP] Japan ................... 62-86898

[51] Int. Cl.⁴ ............................ F02P 5/15
[52] U.S. Cl. ......................... 123/414; 123/418; 123/476; 123/494; 123/617; 324/208
[58] Field of Search ............ 123/414, 416, 418, 476, 123/494, 617, 612; 324/165, 173, 174, 208; 377/2, 17, 19

[56] References Cited

U.S. PATENT DOCUMENTS

| Re. 30,928 | 5/1982 | Fuzzell et al. | 123/414 X |
|---|---|---|---|
| 4,378,004 | 3/1983 | Petrie | 123/414 X |
| 4,485,785 | 12/1984 | Hill | 123/414 X |
| 4,744,343 | 5/1988 | Bisenius et al. | 123/617 X |
| 4,773,381 | 9/1988 | Koshida | 123/617 X |
| 4,783,627 | 11/1988 | Pagel et al. | 324/208 |
| 4,791,366 | 12/1988 | Suzuki et al. | 324/208 |
| 4,796,208 | 1/1989 | Kumagai et al. | 123/414 X |

FOREIGN PATENT DOCUMENTS 0027609 3/1981 Japan .
0198018 9/1986 Japan .

Primary Examiner—Willis R. Wolfe
Attorney, Agent, or Firm—Antonelli, Terry & Wands

[57] ABSTRACT

A rotation angle measuring apparatus comprises a throttle valve for controlling the amount of air flow of an internal combustion engine, a throttle sensor coupled to a rotation shaft of the throttle valve, and a logic circuit which includes absolute rotation angle detecting means for receiving an output signal of the throttle sensor to produce an absolute signal, forward/reverse rotation direction discriminating means for receiving an output signal of the throttle sensor to produce a direction signal, and an up/down counter for receiving the absolute signal, the direction signal and a count signal outputted from the forward/reverse rotation direction discriminating means to output a signal representative of a rotation position of the rotation shaft of the throttle valve.

9 Claims, 9 Drawing Sheets

FIG. I
PRIOR ART
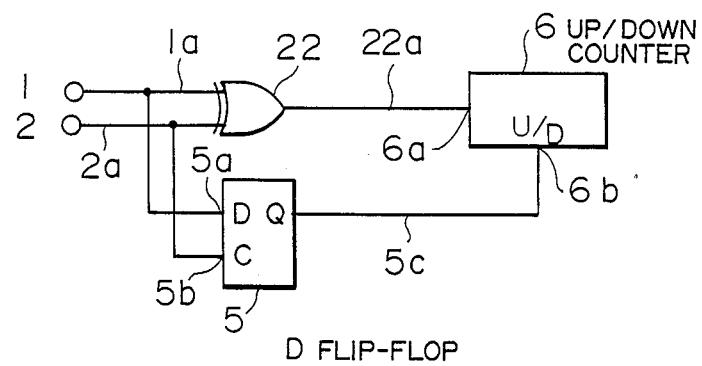
FIG. 2
PRIOR ART
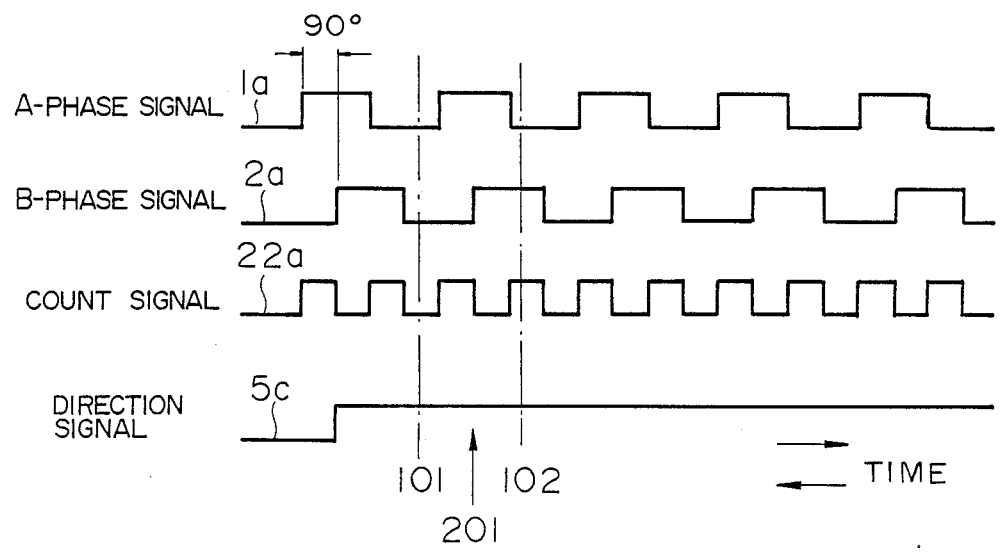

ROTATION ANGLE MEASURING APPARATUS

BACKGROUND OF THE INVENTION

The present invention relates to a rotation angle measuring apparatus for measuring the rotation angle from any given reference rotation position of a rotatory body which makes a rotational motion in a forward/reverse direction.

The conventional rotation angle measuring apparatus is constructed such that a phase difference between two signals phase-shifted from each other by 90° is determined to discriminate the direction of rotation of a rotatory body, as has been disclosed by, for example, JP-A-No. 56-2709. However, in the case where the rotatory body makes a reciprocating motion in a certain range of rotation angle while repeatedly changing the direction of rotation, the measurement of the rotation angle involves an error.

Explanation will first be made of the case where two phase signals are doubled in frequency. FIG. 1 shows a circuit diagram of one example of the conventional rotation angle measuring apparatus in which the direction of rotation is determined from two signals phase-shifted from each other by 90°. Referring to FIG. 1, reference numeral 1 designates an A-phase input terminal, numeral 2 a B-phase input terminal, numeral 5 a D flip-flop, numeral 6 an up/down counter, and numeral 22 an exclusive OR gate. A-phase and B-phase signals 1a and 2a are supplied from the A-phase and B-phase input terminals 1 and 2, respectively. The A-phase signal 1a is applied to one input of the exclusive OR gate 22 and a data input terminal 5a of the D flip-flop 5 while the B-phase signal 2a is applied to the other input of the exclusive OR gate 5 and a clock input terminal 5b of the D flip-flop 5. A signal of an output 22a of the exclusive or gate 22 (or a signal of exclusive OR operation of the A-phase and B-phase signals 1a and 2a) is applied to a clock input terminal 6a of the up/down counter 6 while a signal of a Q-output 5c of the D flip-flop 5 (or a direction signal) is applied to an up/down change-over input terminal 6b of the up/down counter 6.

FIG. 2 is a time chart which illustrates the operation of the circuit shown in FIG. 1. For example, now assume the case where a rotatory body (not shown) which has rotated in a forward direction makes in a repeating period of time between instants 101 and 102 a reciprocating motion in which the direction of rotation changes from the forward direction to a reverse direction and vice versa. Then, since the circuit shown in FIG. 1 is designed such that the A-phase signal 1a is taken in the D flip-flop 5 as data at only the time of rise of the B-phase signal 2a, the direction signal 5c entering the up/down change-over input terminal 6b of the up/down counter 6 does not change as it has indicated the forward direction of rotation. Namely, notwithstanding that the actual rotation angle repeats a reciprocative span in the repeating period of time between instants 101 and 102, the up/down counter 6 continues its count-up operation since the direction signal (or direction discrimination signal) 5c has no change with the "1" level to which it is turned by the rise of the B-phase signal 2a at instant of time 201. As a result, an error takes place in the measurement of the rotation angle.

Next explanation will be made of the case where two phase signals are not doubled in frequency. FIG. 3 shows a circuit diagram of another example of the conventional rotation angle measuring apparatus in which the direction discrimination and the counting are effected by the rise of one of two phase signals. Through the figures of the accompanying drawings, the same reference numerals or symbols are used for designating the identical or corresponding components. An A-phase signal 1a on an A-phase input terminal 1 is applied to a data input terminal 5a of a D flip-flop 5 while a B-phase signal 2a on a B-phase input terminal 2 is applied to a clock input terminal 5b of the D flip-flop 5 and a clock input terminal 6a of an up/down counter 6. A signal of a Q-output 5c of the D flip-flop 5 is applied to an up/down change-over input terminal 6b of the up/down counter 6.

FIG. 4 is a time chart which illustrates the operation of the circuit shown in FIG. 3. Now consider the case where a rotatory body rotates in a forward direction. At instant of time 201 shown by arrow in FIG. 4, the A-phase signal 1a applied to the data input terminal 5a of the D flip-flop 5 takes the level of "1". When the B-phase signal 2a applied to the clock input signal 5b of the D flip-flop 5 rises at this instant of time 201, a signal of "1" (direction signal) is supplied from the Q-output 5c of the D flip-flop 5 to the up/down change-over input terminal 6b of the up/down counter 6 so that the up/down counter 6 takes a count-up condition. At the same time, the B-phase signal 2a branching from the B-phase input terminal 2 is supplied to the clock input terminal 6a of the up/down counter 6 so that the counting by the counter 6 in a forward direction is effected by the rise of the pulse of the B-phase signal 2a. Next consider the case where the rotatory body rotates in a reverse direction. Then, the B-phase signal 2a rises at instant of time 202 indicated by arrow. Since the A-phase signal 1a is in the level of "0" at that time, a signal of "0" (direction signal) is supplied from the Q-output 5c' of the D flip-flop 5 to the up/down change-over input terminal 6b of the up/down counter 6 so that the counting by the counter 6 in a reverse direction is effected by the rise of the B-phase signal 2a applied to the clock terminal 6a of the counter 6.

In the just-mentioned type of apparatus, since the direction discrimination and the counting are effected by only the rise of the B-phase signal 2a, there is no problem if the counting is made after the direction discrimination has been made. However, in the case where the counting is made before the direction discrimination, an error may be produced, thereby making the measurement inaccurate.

FIG. 5 shows a circuit diagram of a further example of the conventional rotation angle measuring apparatus in which the direction discrimination is effects by the rise of one of two phase signals and thereafter the counting is effected by the rise of the other phase signal. In FIG. 5, reference numeral 23 designates an inverter. The construction of the circuit shown in FIG. 5 is different from the circuit of FIG. 3 in that an A-phase signal 1a is used as an input signal to a clock input terminal 6a of an up/down counter 6. Practically, the A-phase signal 1a is inverted by the inverter 23 and an A-phase signal on the inverted output 23a of the inverter 23 is used as the clock input signal to the clock input terminal 6a of the up/down counter 6.

FIG. 6 is a time chart which illustrates the operation of the circuit shown in FIG. 5. In the case where a rotatory body rotates in a forward direction, the A-phase signal 1a applied from the A-phase input terminal 1 to a data input terminal 5a of a D flip-flop 5 is in the level of "1" at instant of time 201 indicated by arrow. By the rise 201 of the pulse of the B-phase signal 2a applied to the clock input terminal 5b of the D flip-flop 5 at this time a signal of "1" of a Q-output 5c of the D flip-flop 5 (direction signal) is delivered to an up/down change-over input terminal 6b of the up/down counter 6 so that the counter 6 takes a count-up condition. Thereafter, at instant of time 231 indicated by arrow, the rise 231 of the $\overline{A}$-phase signal on the output 23a of the inverter 23 applied to the clock terminal 6a of the up/down counter 6 causes the counter to perform its counting operation. On the other hand, in the case where the rotatory body rotates in a reverse direction, the A-phase signal 1a is in the level of "0" at instant of time 202 indicated by arrow and at this time the rise 202 of the pulse of the B-phase signal 2a causes the direction signal of "0" on the Q-output 5c' of the D flip-flop 5 to be inputted to the up/down change-over input terminal 6a of the up/down counter 6. Thereafter, at instant of time 232 indicated by arrow, the rise 232 of the $\overline{A}$-phase signal effects a counting operation of the counter 6 in a reverse direction or a count-down operation.

In the circuit shown in FIG. 5, in the case where the rotatory body makes a reciprocating motion in a repeating period of time between instants 101 and 102 indicated by dotted chain lines, the B-phase signal 2a only repeats its rise 201 at instant of time 201 indicated by arrow. Since the A-phase signal 1a is always in the level of "0" at that time, the direction signal on the Q-output 5c of the D flip-flop 5 is not changed or is always maintained to the level of "1". Accordingly, the up/down counter 6 repeats the counting operation in the forward direction or the count-up operation, thereby causing a measurement error.

JP-A-No. 61-198018 discloses a position detecting apparatus including means by which each time a rotating signal of a rotatory body changes, the forward-/reverse direction rotation direction of the signal immediately after the change is discriminated. However, the discriminating means requires three sensors, which makes the circuit construction complicate.

As is apparent from the foregoing, though the above-described conventional rotation angle measuring apparatuses discriminate the rotation direction of a rotatory body on the basis of two phase signals having a phase difference therebetween, no consideration is taken of the case where the rotatory body makes a reciprocating motion while repeatedly changing the rotation direction in a certain range of rotation angle. Therefore, there is a problem that the measurement of the rotation angle involves an error.

SUMMARY OF THE INVENTION

An object of the present invention is to provide a rotation angle measuring apparatus in which the discrimination of the rotation direction of a rotatory body is made by two phase signals having a phase difference therebetween but the rotation angle of the rotatory body can be measured without any error even if the rotatory body repeats a reciprocating motion in a certain range of rotation angle.

The above object can be achieved by a rotation angle measuring apparatus which performs the measurement of the rotation angle of a rotatory body by means of two phase signals with a phase difference therebetween generated for each predetermined rotation angle of the rotatory body and is provided with means for discriminating the direction of rotation of the rotatory body each time the counting is made by the control of a clock signal and effecting the counting after the direction has been determined.

In the rotation angle measuring apparatus according to the present invention, the direction of rotation of the rotatory body is discriminated each time the counting in each of forward and reverse directions is made under the control of the clock signal of a control clock generator and by using the two phase signals having the phase difference and the counting is effected after the rotation direction has been determined immediately before the counting. Therefore, by making the frequency of the clock signal sufficiently higher than the frequency of rotation of the rotatory body, the rotation angle of the rotatory body can be measured without any error even if the rotatory body repeats a reciprocating motion in a certain range of rotation angle.

The rotation angle measuring apparatus of the present invention is preferably applicable to the detection of the rotation position of a throttle valve of an internal combustion engine.

BRIEF DESCRIPTION OF THE DRAWINGS

FIG. 1 is a circuit diagram showing one example of the conventional rotation angle measuring apparatus;

FIG. 2 is a time chart illustrating the operation of the circuit shown in FIG. 1;

DESCRIPTION OF THE PREFERRED EMBODIMENTS

An embodiment of the present invention will now be explained by virtue of FIGS. 7 and 8.

Figure 3:
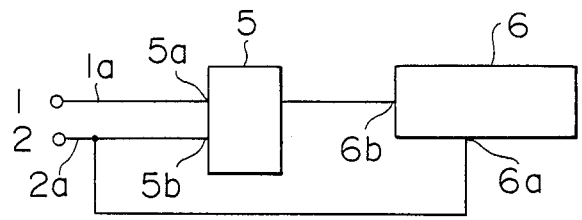
FIG. 3 is a circuit diagram showing another example of the conventional rotation angle measuring apparatus.
Figure 4:
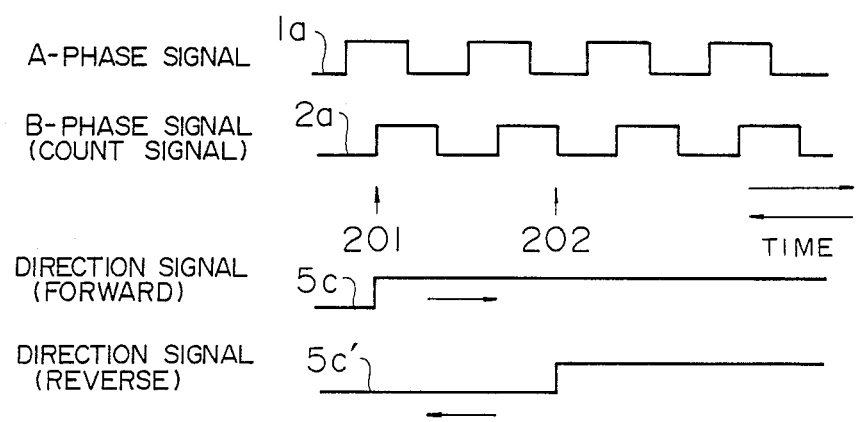
FIG. 4 is a time chart illustrating the operation of the circuit shown in FIG. 3.
Figure 5:
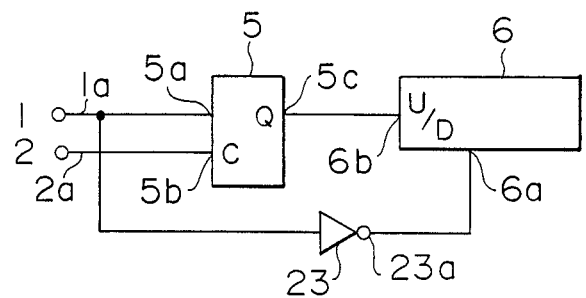
FIG. 5 is a circuit diagram showing a further example of the conventional rotation angle measuring apparatus.
Figure 6:
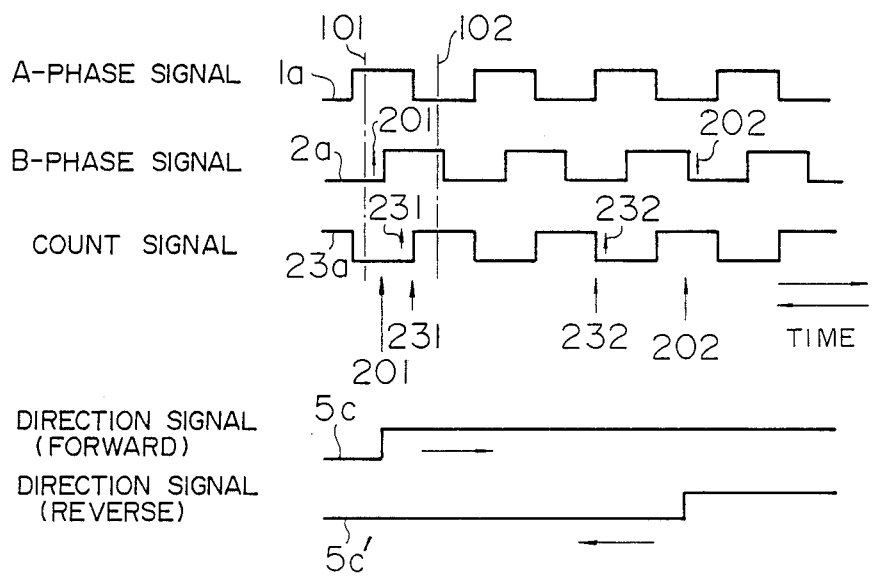
FIG. 6 is a time chart illustrating the operation of the circuit shown in FIG. 5.
Figure 7:
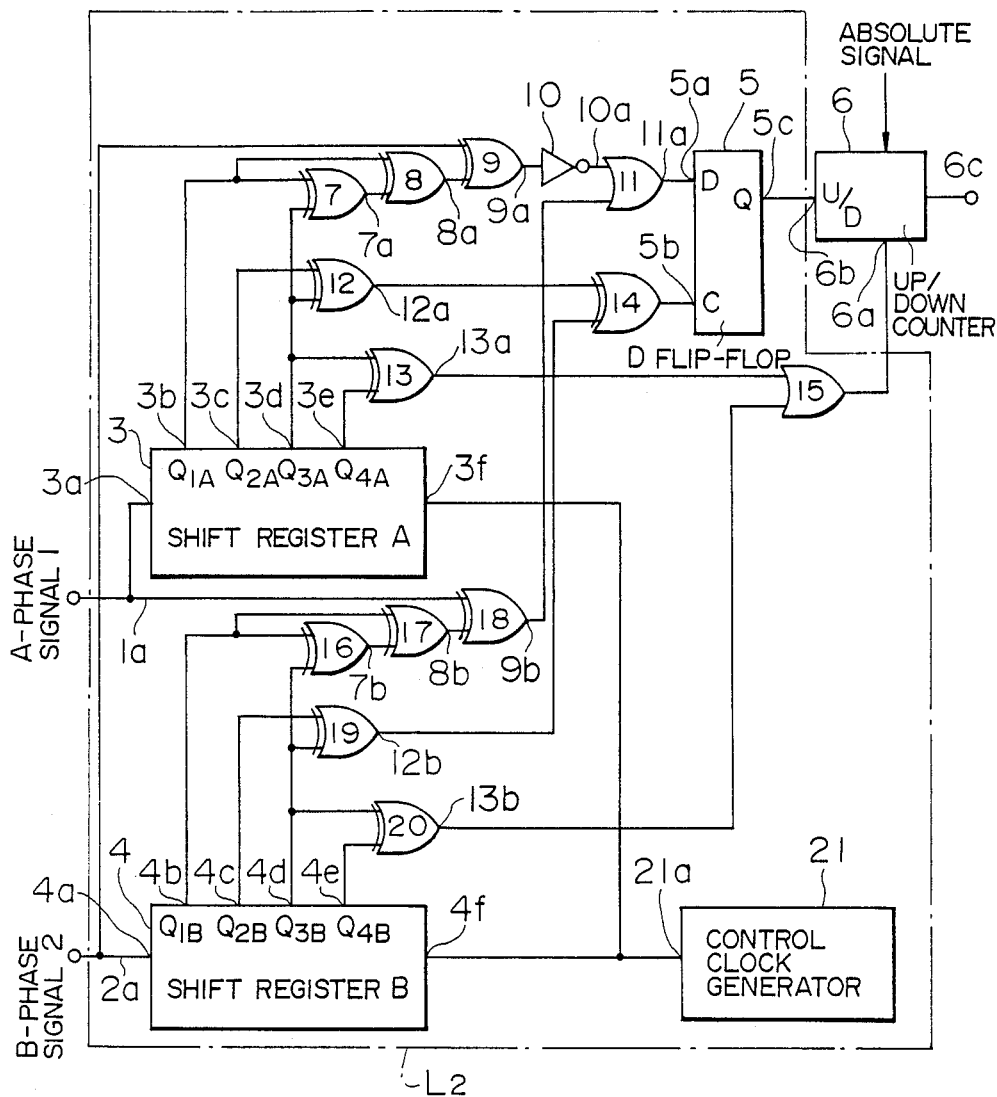
FIG. 7 shows a circuit diagram of a rotation angle measuring apparatus according to an embodiment of the present invention.

FIG. 7 shows a circuit diagram of a rotation angle measuring apparatus according to an embodiment of the present invention. In FIG. 7, reference numeral 1 designates an A-phase input terminal, and numeral 2 a B-phase input terminal. Numeral 3 designates a shift register A, numeral 3a an input terminal of a signal to be shifted, numerals 3b, 3c, 3d and 3e $Q_{1A}$, $Q_{2A}$, $Q_{3A}$ and $Q_{4A}$ outputs, respectively, and numeral 3f an input terminal of a clock signal. Numeral 4 designates a shift register B, numeral 4a an input terminal of a signal to be shifted, numerals 4b, 4c, 4d and 4e $Q_{1B}$, $Q_{2B}$, $Q_{3B}$ and $Q_{4B}$ outputs, respectively, and numeral 4f an input terminal of a clock signal. Numeral 5 designates a D flip-flop, numeral 5a a data input terminal, numeral 5b an input terminal of a clock signal, and numeral 5c a Q-output. Numeral 6 designates an up/down counter, numeral 6a an input terminal of a clock signal, numeral 6b an up/down change-over input terminal, and numeral 6c an output terminal. Numerals 7, 8, 9, 12, 13, 14, 16, 17, 18, 19 and 20 exclusive OR gates, numeral 10 an inverter, numerals 11 and 15 OR gates, and numeral 21 a control clock generator for the shift registers 3 and 4.

The A-phase input terminal 1 is connected to the input terminal 3a of the shift register 3 and one input of the exclusive OR gate 18. The B-phase input terminal 2 is connected to the input terminal 4a of the shift resistor 4 and one input of the exclusive OR gate 9. The $Q_{1A}$ output 3b of the shift register 3 is connected to one input of the exclusive OR gate 7 and one input of the exclusive OR gate 8, the $Q_{2A}$ output 3c is connected to one input of the exclusive OR gate 12, the $Q_{3A}$ output 3d is connected to the other input of the exclusive OR gate 12 and one input of the exclusive OR gate 13, and the $Q_{4A}$ output 3e is connected to the other input of the exclusive OR gate 13. The output 7a of the exclusive OR gate 7 is connected to the other input of the exclusive OR gate 8, the output 8a of the exclusive OR gate 8 is connected to the other input of the exclusive OR gate 9, the output 9a of the exclusive OR gate 9 is connected through the inverter 10 to one input of the OR gate 11, the output 12a of the exclusive OR gate 12 is connected to one input of the exclusive OR gate 14, and the output 13a of the exclusive OR gate 13 is connected to one input of the OR gate 15. The $Q_{1B}$, $Q_{2B}$, $Q_{3B}$ and $Q_{4B}$ outputs 4b, 4c, 4d and 4e of the shift register 4 are connected to inputs of the exclusive OR gates 16, 19 and 20 as shown in a similar manner to the $Q_{1A}$, $Q_{2A}$, $Q_{3A}$ and $Q_{4A}$ outputs 3b, 3c, 3d and 3e of the shift register 3, the outputs 7b and 8b of the exclusive OR gates 16 and 17 are connected as shown in a similar manner to the outputs 7a and 8a of the exclusive OR gates 7 and 8, the output 9b of the exclusive OR gate 18 is connected to the other input of the OR gate 11, the output 12b of the exclusive OR gate 19 is connected to the other input of the exclusive OR gate 14, and the output 13b of the exclusive OR gate 20 is connected to the other input of the OR gate 15. The output 11a of the OR gate 11 is connected to the data input terminal 5a of the D flip-flop 5, the output of the exclusive OR gate 14 is connected to the clock input terminal 5b of the D flip-flop 5, the Q-output 5c of the D flip-flop 5 is connected to the up/down change-over input terminal 6b of the up/down counter 6, and the output of the OR gate 15 is connected to the clock input terminal 6a of the up/down counter 6. The output 21a of the control clock generator 21 is connected to the clock input terminals 3f and 4f of the shift registers 3 and 4.

Figure 8:
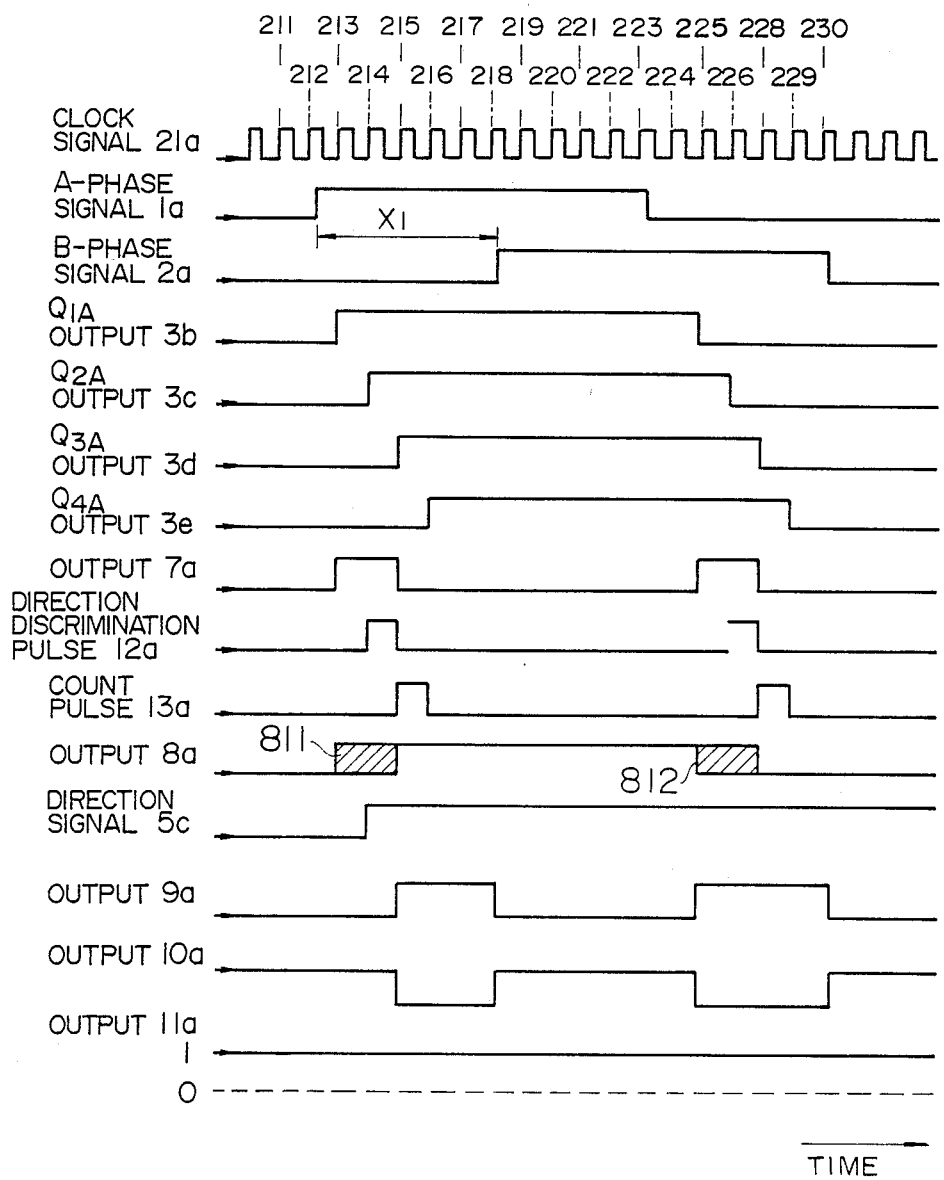
FIGS. 8 and 9 show waveforms for explaining the operation of the embodiment shown in FIG. 7.

FIG. 8 shows a time chart in the case where the counting in a forward direction is made after the direction of rotation of a rotatory body (not shown) has been discriminated each time the pulse of the A-phase signal rises and each time it falls. In FIG. 8, reference numeral 21a designates the clock signal, numeral 1a the A-phase signal, numeral 2a the B-phase signal, numeral 12a a direction discrimination pulse, numeral 13a a count pulse, and numeral 5c a direction pulse. The rises of the pulses of the clock signal 21a on the output of the control clock generator 21 are indicated by numerals 211 to 229. When the A-phase signal 1a (see FIG. 8) from A-phase input terminal 1 is applied to the input terminal 3a of the shift register 3, the shift register 3 produces sequentially shifted signals on the $Q_{1A}$, $Q_{2A}$, $Q_{3A}$ and $Q_{4A}$ outputs 3b, 3c, 3d and 3e at the rises 213, 214, 215 and 216 of the clock pulse signal 21a. A signal shown as the output 7a is a signal of the exclusive OR operation of the $Q_{1A}$ and $Q_{3A}$ outputs 3b and 3d of the shift register 3 or an output signal of the exclusive OR gate 7, the direction discrimination pulse 12a is a signal of the exclusive OR operation of the $Q_{2A}$ and $Q_{3A}$ outputs 3c and 3d of the shift register 3 or an output signal of the exclusive OR gate 12, and the count pulse 13a is a signal of the exclusive OR operation of the $Q_{3A}$ and $Q_{4A}$ outputs 3d and 3e of the shift register 3 or an output signal of the exclusive OR gate 13. A signal shown as the output 8a is a signal of the exclusive OR operation of the $Q_{1A}$ output 3b of the shift register 3 and the output 7a of the exclusive OR gate 7 or an output signal of the exclusive OR gate 8. At shaded portions 811 and 812 of the output 8a or in a period of time between the rises 213 and 215 of the clock signal 21a and in a period of time between the rises 225 and 228 thereof, the exclusive OR gate is opened to examine the logical value of the B-phase signal 2a on the B-phase input terminal 2. The direction signal 5c being an output signal of the Q-output 5c of the D flip-flop 5 is applied to the up/down change-over input terminal 6b of the up/down counter 6.

Next, the operation of the circuit shown in FIG. 7 will be explained referring to FIG. 8. The output signal 7a of the exclusive OR gate 7 being the signal of the exclusive OR operation of the $Q_{1A}$ and $Q_{3A}$ outputs 3b and 3d of the shift register 3 is used to open the exclusive OR gate 9 in the period of time between the rises 213 and 215 of the clock signal 21a and in the period of time between the rises 225 and 228 thereof in order to examine the logical value of the B-phase signal 2a at the times of rise and fall of the A-phase signal 1a. During the above-mentioned periods, the exclusive OR gate 9 produces the exclusive OR operation of the B-phase signal and the output signal 8a of the exclusive OR gate 8 to provide data of the rotation direction which in turn is passed through the inverter 10 so as to define the rotation in a forward direction as "1" and thereafter applied to the data input terminal 5a of the D flip-flop 5 through the OR gate 11 (see outputs 9a, 10a and 11a in FIG. 8). Next, the direction discrimination pulse 12a being the output of the exclusive OR gate 12 or the exclusive OR operation of the $Q_{2A}$ and $Q_{3A}$ outputs 3c and 3d of the shift register 3 rises and is applied to the clock input terminal 5b of the D flip-flop 5 through the exclusive OR gate 14 which is provided for preventing the direction discrimination pulse 12a from the shift register 3 from rising simultaneously with the direction discrimination pulse 12b from the shift register 4. The direction signal 5c being the Q-output of the D flip-flop 5 is turned to "1" at the rise 214 of the clock signal 21a and is applied to the up/down change-over input terminal 6b of the up/down counter 6 to establish a count-up condition of the up/down counter 6. Next, at the rise 215 of the clock signal 21a, the count pulse 13a being the output of the exclusive OR gate 13 or the exclusive OR operation of the $Q_{3A}$ and $Q_{4A}$ outputs 3d and 3e of the shift register 3 rises and is applied to the clock input terminal 6a of the up/down counter 6 through the OR gate for producing a logical sum with the count pulse 13b from the shift register 4, so that a count-up operation of the up/down counter 6 is effected. The output of the up/down counter 6 is delivered as information of the rotation angle of the rotatory body from the output terminal 6c.

In the case where the rotatory body rotates in a reverse direction, too, the exclusive OR gate 9 is opened by the output 7a of the exclusive OR gate 7 to examine the logical value of the B-phase signal 2a at the time of rise and fall of the A-phase signal 1a. And, by turning the direction discrimination pulse 12a on the output of the exclusive OR gate 12 to "0", the counting in a reverse direction or a count-down operation is effected. In the circuit of FIG. 7, the direction of rotation is examined by the shift register 4 for each of the rise and fall of the B-phase signal 2a and immediately before the counting. However, since in FIG. 8 the A-phase signal 1a is in advance of the B-phase signal 2a in the case of the rotation in the reverse direction, a signal outputted from the exclusive OR gate 18 is reverse to the logical value of the output 9a of the exclusive OR gate 9. Namely, the logical value of the output signal 9b of the exclusive OR gate 18 is "1" in the case of the rotation in the forward direction and "0" in the case of the rotation in the reverse direction. This logic coincides with the logic of the up/down change-over of the up/down counter 6. Therefore, it is not necessary to invert the output 9b of the exclusive OR gate 18 by an inverter. Accordingly, the output 9b of the exclusive OR gate 18 is applied to the OR gate 11 as it is. The OR gate 11 is provided for allowing the discrimination of the rotation direction at both the rise and all of each of the A-phase and B-phase signals 1a and 2a.

Figure 9:
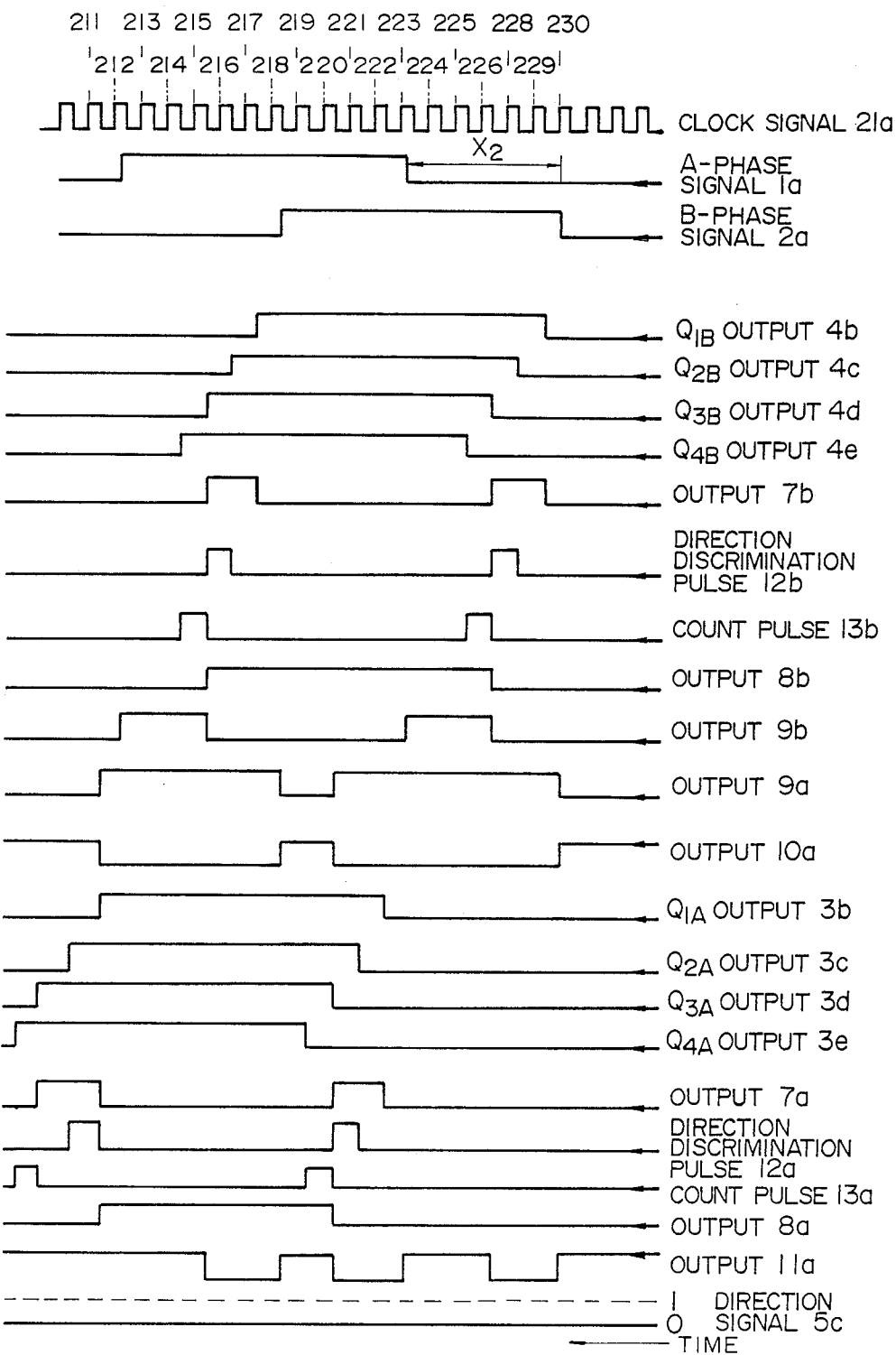

In the foregoing, the explanation of operation in the case where the rotatory body rotates in the reverse direction has been mainly made by use of FIGS. 7 and 8 though the explanation of operation in the case of the rotation in the reverse direction has been partially made. Next, the explanation of operation in the case where the rotatory body rotates in the reverse direction will be further made by virtue of waveforms shown in FIG. 9. The operation in the case of the reverse rotation is the same as that in the case of the forward rotation. But, in a region $X_2$ where the A-phase signal 1a is in the level of "0" and the B-phase signal 2a is in the level of "1", since all the $Q_{1A}$, $Q_{2A}$, $Q_{3A}$ and $Q_{4A}$ outputs 3b, 3c, 3d and 3e of the shift register 3 are "0", all the outputs 8a, 12a , 13a and 10a are also "0". This is better illustrated in FIG. 9. Various outputs 7b, 8b, 12b and 13b shown in the logic circuit diagram of FIG. 7 are as shown in FIG. 9. Therefore, the direction signal 5c, the direction discrimination signal 12b and the count pulse 13b assume waveforms as shown in FIG. 9. Thus, since the rotation direction is discriminated by the direction discrimination pulse 12b immediately before the counting operation of the counter 6 in response to the input of the count pulse 13b thereto, like the operation in the above-mentioned case where the rotatory body rotates in the forward direction, the occurrence of an error can be prevented even if the rotatory body repeats a reciprocating motion in a certain range of rotation angle.

The above-mentioned embodiment has used a logic circuit LC. A microcomputer may be used in place of the logic circuit. However, when the required signal processing is to be performed in accordance with a series of programs by the microcomputer, the microcomputer must have a relatively high performance and high speed. The signal processing by the logic circuit LC has a merit that it can be made at a sufficiently high speed.

As has been mentioned above, according to the present embodiment, since for each of the forward and reverse rotation directions of the rotatory body the direction discrimination is made each time the counting is to be made and the counting by the up/down counter 6 is performed after one period of the clock signal 21a from the clock generator 21 after the direction has been determined by the fact that the direction discrimination pulse 12a rises immediately before the counting is made, the measurement of the rotation angle can be made without any error by selecting the frequency of the clock signal 21a to be sufficiently high as compared with the frequency of rotation of the rotatory body.

According to the present invention, since the direction of rotation of a rotatory body is discriminated each time the counting is made by a count signal produced from two phase-shifted signals and the counting is performed after the rotation direction has been determined, there is an effect that the measurement of the rotation angle can be made without any error.

Figure 10:
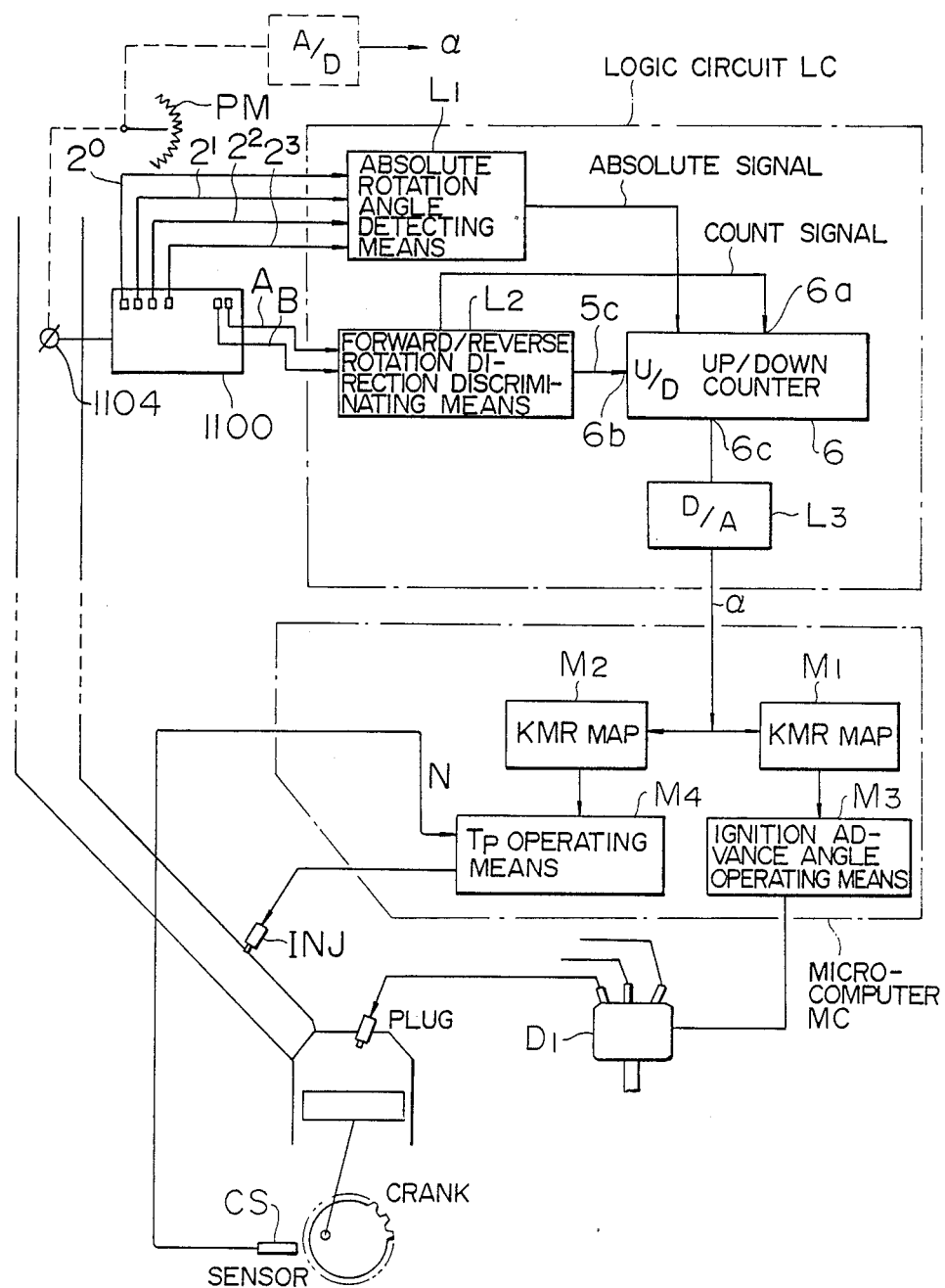
FIG. 10 shows in block diagram an example of the case where the rotation angle measuring apparatus of the present invention is applied to the measurement of the rotation angle of the shaft of a throttle valve of a vehicle.
Figure 11:
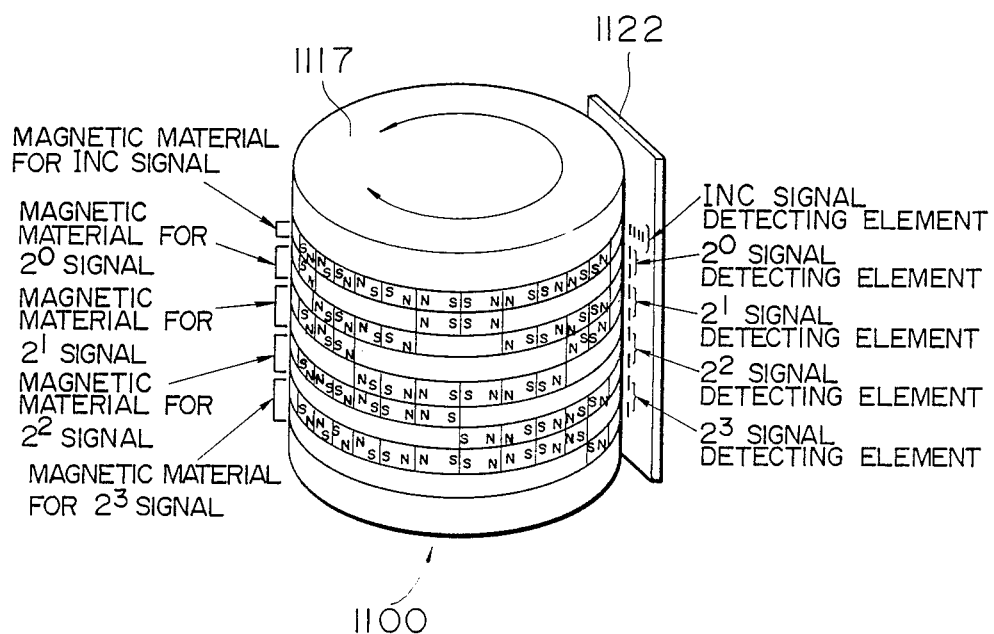
FIG. 11 is a perspective view showing the schematic construction of a throttle sensor.
Figure 12:
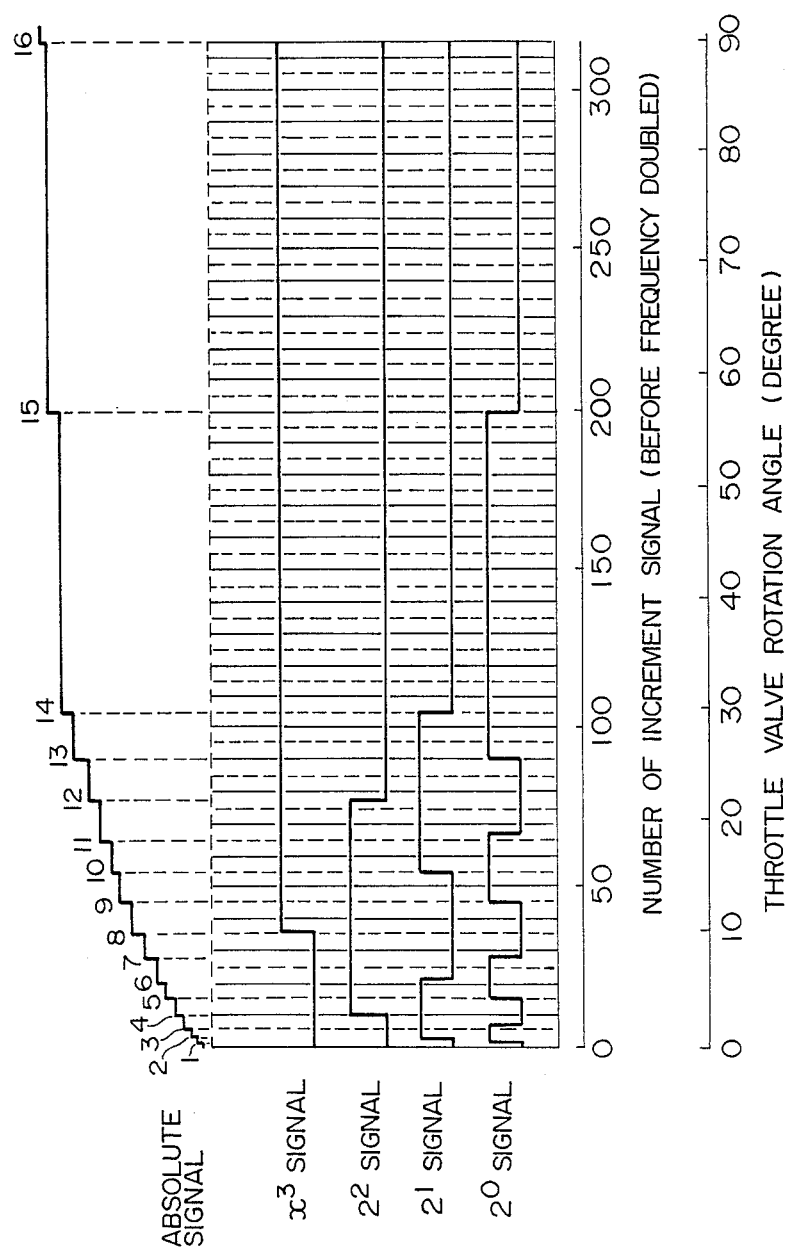
FIG. 12 is a graph showing an absolute signal representative of the rotation angle of the throttle valve.

FIG. 10 shows an example of the case where the above-mentioned rotation angle measuring apparatus of the present invention is applied to the measurement of the rotation angle of a throttle valve shaft 1104 of a vehicle. The throttle valve shaft 1104 is coupled to a magnetic drum 1117 of a throttle sensor 1100. As is schematically shown in FIG. 11, the throttle sensor 1100 is constructed by the magnetic drum 1117 coupled to the throttle valve shaft 1104 and having N and S poles magnetized as shown, and a magnetoresistive element substrate 1122 provided in the vicinity of the outer periphery of the magnetic drum 1117 and including $2^0$, $2^1$, $2^2$ and $2^3$ signal detecting elements for producing an absolute signal of the rotation angle and an INC signal detecting element for obtaining the A-phase and B-phase signals. As is shown in FIG. 12, the absolute signal is obtained from the $2^0$, $2^1$, $2^2$ and $2^3$ signals and provides a non-linear 16-step representation of the rotation angle of the throttle valve in a range from 0° to 90°.

The $2^0$, $2^1$, $2^2$ and $2^3$ signals and the A-phase and B-phase signals are respectively inputted to an absolute rotation angle detecting means L1 and a forward-/reverse rotation direction discriminating means L2 (see FIG. 7) in a logic circuit LC. When an output 5c from the rotation direction discriminating means L2, the absolute signal from the absolute rotation angle detecting means L1 and a count signal 6a from the rotation direction discriminating means L2 are inputted to the up/down counter 6, the up/down counter 6 outputs a signal 6c representative of the rotation angle of the throttle valve. This signal 6c is subjected to a digital-to-analog conversion by a D/A converter L3 to produce a signal a representative of the rotation angle of the throttle valve. Thus, the logic circuit LC is constructed by the absolute rotation angle detecting means L1, the forward/reverse rotation direction discriminating means L2, the up/down counter 6 and the D/A converter L3.

The throttle valve rotation angle data α (data representative of the rotation position of a rotatory body) is inputted to a microcomputer MC. More especially, the data α is inputted to a KMR map M1 for operating an ignition advance angle and a KMR map M2 for operating a fuel supply amount (or fuel injection amount) $T_p$. Data read from the KMR maps M1 and M2 on the basis of the data α are inputted to an ignition advance angle operating means M3 and a $T_p$ operating means M4, respectively. An output signal of the ignition advance angle operating means M3 controls the ignition advance angle of a distributor D1. In the $T_p$ operating means M4, data N of the number of rotation of an engine is taken in from a crank sensor CS to operate the fuel ignition amount $T_p$. An output signal of the $T_p$ operating means M4 controls the injection time width of an injector INJ.

Alternatively, the throttle valve rotation angle data $\alpha$ can be obtained by converting the rotation angle of the throttle valve shaft 1104 into an electric signal by a potentiometer PM and converting through, for example, an A/D converter this electric signal into a digital signal $\alpha$ which is capable of being processed by a computer.

We claim:

1. A rotation angle measuring apparatus for measuring the rotation angle of a rotatory body by two phase signals with a phase difference therebetween generated for each predetermined rotation angle of the rotatory body, comprising means for discriminating the direction of rotation of the rotatory body each time the counting is made by said two phase signals and outputting as information of the rotation angle an output of a counter which performs its counting operation after the rotation direction has been determined.

2. A rotation angle measuring apparatus according to claim 1, wherein said counter performs a count-up operation when said rotatory body rotates in a first direction and a count-down operation when said rotatory body rotates in a second direction.

3. A rotation angle measuring apparatus comprising a logic circuit including:
   absolute angle detecting means for detecting an absolute rotation angle of a rotatory body to output an absolute signal;
   forward/reverse rotation direction discriminating means for outputting a direction signal indicative of the forward/reverse rotation direction of said rotatory body and a count signal; and
   an up/down counter for receiving said absolute signal, said direction signal and said count signal to perform a count-up operation when said direction signal indicates a first direction and a count-down operation when said direction signal indicates a second direction reverse to said first direction, thereby outputting a signal representative of a rotation position of said rotatory body.

4. A rotation angle measuring apparatus according to claim 3, wherein said rotatory body is a throttle valve shaft of an internal combustion engine, and said absolute rotation angle detecting means and said forward/reverse rotation direction discriminating means are connected to an output of a throttle sensor including a magnetic drum coupled to said throttle valve shaft.

5. A rotation angle measuring apparatus according to claim 3, wherein said rotation position signal is used to control the ignition advance angle of an internal combustion engine.

6. A rotation angle measuring apparatus according to claim 5, further comprising a KMR map for outputting, on the basis of said rotation position signal, data necessary for operating the ignition advance angle, and ignition advance angle operating means for operating the ignition advance angle on the basis of an output of said KMR map and outputting data of the ignition advance angle to a distributor.

7. A rotation angle measuring apparatus according to claim 3, wherein said rotation position signal is used to control the fuel supply amount of an internal combustion engine.

8. A rotation angle measuring apparatus according to claim 7, further comprising a KMR map for outputting, on the basis of said rotation position signal, data necessary for operating the fuel supply amount, and fuel supply amount operating means for operating the fuel supply amount of the basis of an output of said KMR map and data of the rotation speed of said internal combustion engine.

9. A rotation angle measuring apparatus comprising:
   a throttle valve for controlling the amount of air flow of an internal combustion engine;
   a throttle sensor coupled to a rotation shaft of said throttle valve; and
   a logic circuit including absolute relation angle detecting means for receiving an output signal of said throttle sensor to produce an absolute signal, forward/reverse rotation direction discriminating means for receiving an output signal of said throttle sensor to produce a direction signal, and an up/down counter for receiving said absolute signal, said direction signal and a count signal outputted from said forward/reverse rotation direction discriminating means to output a signal representative of a rotation position of said rotation shaft.

* * * * *